United States Patent [19]

Sanford

[11] Patent Number: 5,734,164
[45] Date of Patent: Mar. 31, 1998

[54] CHARGED PARTICLE APPARATUS HAVING A CANTED COLUMN

[75] Inventor: Colin A. Sanford, Windham, N.H.

[73] Assignee: Amray, Inc., Bedford, Mass.

[21] Appl. No.: 757,727

[22] Filed: Nov. 26, 1996

[51] Int. Cl.⁶ ......................................................... H01J 37/28
[52] U.S. Cl. ........................................ 250/310; 250/442.11
[58] Field of Search ........................... 250/310, 440.11, 250/442.11, 443.11

[56] References Cited

U.S. PATENT DOCUMENTS

| | | | |
|---|---|---|---|
| 2,215,979 | 9/1940 | Schuchmann | 250/141 |
| 3,086,112 | 4/1963 | Riecke | 250/49.5 |
| 3,629,577 | 12/1971 | Weber et al. | 250/49.5 |
| 3,876,879 | 4/1975 | McAdams et al. | 250/307 |
| 3,997,807 | 12/1976 | Riddle et al. | 313/449 |
| 4,398,079 | 8/1983 | Dard et al. | 219/121 |
| 4,460,827 | 7/1984 | Onoguchi et al. | 250/310 |
| 4,627,009 | 12/1986 | Holmes et al. | 364/559 |
| 4,643,587 | 2/1987 | Makabe et al. | 250/443.11 |
| 4,860,224 | 8/1989 | Cashell et al. | 250/443.11 |
| 4,891,516 | 1/1990 | Balter | 250/310 |
| 4,916,315 | 4/1990 | Otaka | 250/310 |
| 5,029,250 | 7/1991 | Komatsu et al. | 250/310 |
| 5,093,572 | 3/1992 | Hosono | 250/310 |
| 5,093,573 | 3/1992 | Mikoshiba et al. | 250/310 |
| 5,229,607 | 7/1993 | Matsui et al. | 250/306 |
| 5,329,125 | 7/1994 | Feuerbaum | 250/442.11 |
| 5,448,064 | 9/1995 | Matsuyama | 250/310 |

*Primary Examiner*—Kiet T. Nguyen
*Attorney, Agent, or Firm*—Marshall, O'Toole, Gerstein, Murray & Borun

[57] ABSTRACT

A charged particle beam apparatus has a carrier for supporting a sample. A tilt mechanism is provided for tilting the wafer carrier through a range of attitudes including an attitude wherein a normal to the carrier defines a predetermined first angle on one side of vertical. A charged particle beam column irradiates a sample on the carrier with a beam of charged particles. The column is canted at a second angle on the opposite side of vertical from the stage normal such that the angle of beam incidence on the sample relative to the stage normal is equal to the sum of the first and second angles. The carrier may be tilted an attitude at the other end of the range of attitudes which is such that the carrier normal is parallel to the column axis and the beam is thus normal to the sample. The first and second angles in limit preferably equal thirty degrees, and the maximum angle of beam incidence on the sample thus equals sixty degrees.

6 Claims, 3 Drawing Sheets

U.S. Patent  Mar. 31, 1998  Sheet 1 of 3  5,734,164

CHARGED PARTICLE APPARATUS HAVING A CANTED COLUMN

BACKGROUND OF THE INVENTION

This invention concerns an improvement for SEMs (scanning electron microscopes) or other charged particle apparatus—in particular, an improvement in the mounting of the charged particle beam column relative to a tiltable stage for greatly improved mechanical properties and performance of the system.

Traditionally, in a scanning electron microscope, for example, the electron optical column is mounted vertically in the top wall of a hermetically sealed vacuum chamber in which the sample is located.

This geometrical arrangement is satisfactory when the samples are small, but creates significant difficulties in applications wherein the samples are large and maximum tilting of the sample is required. For example, in the semiconductor industry wafer sizes are approaching 12 inches in diameter, and sample tilt angles of 60 degrees (relative to a normal to the sample) are demanded.

As the wafer size grows, the height of the vacuum chamber must also grow in order to accommodate the wafer when tilted. As the chamber size grows to accommodate large wafers at high tilt angles, the stiffness of the chamber decreases unless the wall thickness of the chamber is increased. Typical chamber walls are several inches thick. (Chamber stiffness is necessary to reduce the effects of acoustic vibrations, and thereby to permit high performance operation of the equipment.) However, increased chamber wall thickness translates to substantially increased equipment cost and weight.

Further, the total internal surface area of the chamber expands with the square of chamber height dimension, aggravating the contamination of the vacuum environment within the chamber by outgassing of the chamber inner surfaces.

Also, the increased chamber volume which results from the use of large samples at high stage tilt angles increases the volume of gas which must be pumped from the chamber, extending the pump-down times and thus reducing the equipment through-put.

The demands on the design of an X-Y stage increase substantially with specimen size and tilt angle. Typical stages are designed to tilt asymmetrically from 0–60 degrees. The tilt cradle has substantial mass. An extremely robust and costly design configuration is necessary in order to assure adequate resistance of such stages to vibration. Vibration must be suppressed to a few nanometers for high performance applications. The design burdens on such a structure are substantial, as the center of gravity of the stage shifts significantly during the tilting of the stage. The net result is that a stage which is capable of smoothly and precisely rotating a large sample through tilt angles as large as 60 degrees, and which can lock the sample precisely in the chosen position with acceptably low vibration, is costly.

Further, when a stage is rotated to a high tilt angle, the sample (a semiconductor wafer, for example) is apt to move due to gravitational forces which urge the sample down the carrier. Slippage of the sample by only a few microns will result in degradation of the important eucentric tilt and rotation performance parameters of the stage.

SUMMARY OF THE INVENTION

In accordance with an aspect of the present invention, a charged particle apparatus such as a scanning electron microscope has a stage for supporting a sample. Means are provided for tilting the stage through a range of attitudes to a predetermined attitude wherein a normal to the stage defines a first predetermined angle on one side of vertical. A charged particle column for irradiating a sample on the stage is canted at a second angle on the opposite side of vertical such that the angle of beam incidence on the sample is equal to the sum of the first and second angles.

The present invention makes possible the use of a stage which may be symmetrically tilted through a relatively modest angle and yet produce a relatively large angle of incidence of the beam relative to a sample supported by the stage. By way of example, the column may be canted at a cant angle of 30 degrees relative to vertical. The stage need then only be tilted by 30 degrees toward the column to establish a 60 degree angle of incidence relative to a normal to the stage.

By this invention, the vacuum chamber height, inner surface area and volume are substantially reduced, enabling the necessary chamber stiffness to be achieved at significantly reduced weight and cost compared to prior art systems. Reduction of the chamber internal surface area reduces the contamination of the vacuum environment due to chamber surface outgassing. Reduction in the chamber volume reduces critical pump-down times and thus increases equipment through-put.

The stage design encumbrances are greatly alleviated, as the stage need only tilt symmetrically through a modest tilt angle, 30 degrees in the above example, in order to achieve a high angle of incidence of the beam with the sample—60 degrees in the above example. The favorable results of lessening the design constraints on the stage are found in cost, weight, and design simplicity. A lighter stage is not only less costly, but is more agile, reducing the time required to make stage adjustments.

PRIOR ART

U.S. Pat. No. 4,398,079-Dard et al.
U.S. Pat. No. 4,460,827-Onoguchi et al.
U.S. Pat. No. 4,891,516-Balter
U.S. Pat. No. 5,093,572-Hosono
U.S. Pat. No. 5,329,125-Feuerbaum

DESCRIPTION OF THE PREFERRED EMBODIMENTS

Figure 1:
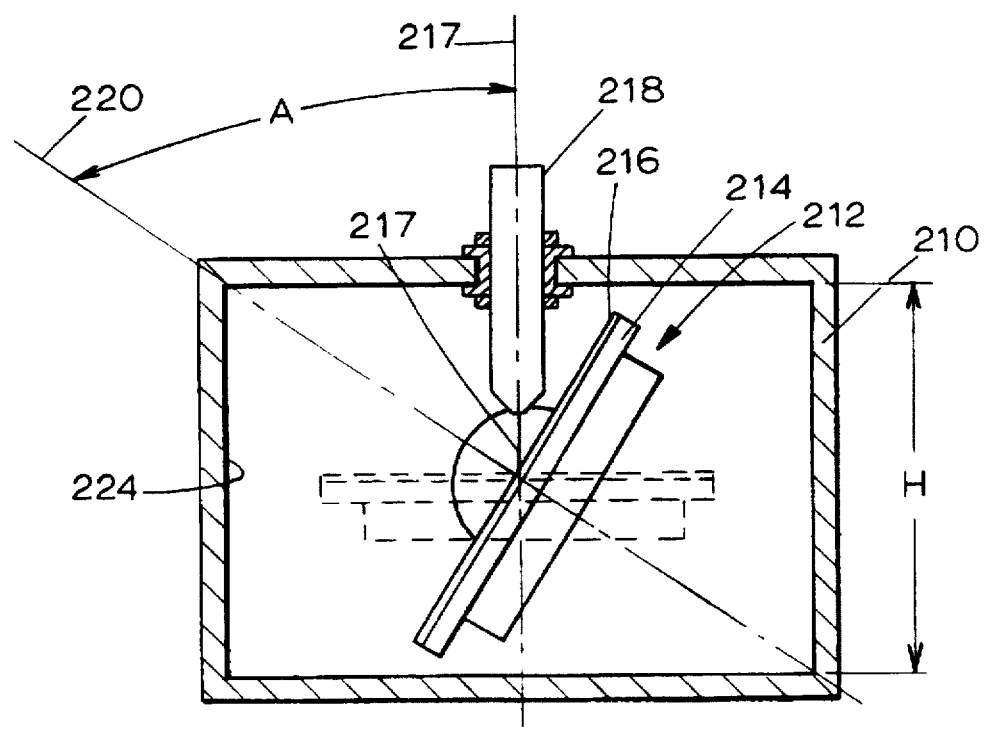
FIG. 1 is a schematic illustration of a prior art charged particle apparatus.

FIG. 1 schematically illustrates a traditional prior art charged particle apparatus such as a scanning electron microscope, comprising a vacuum chamber 210 within which is located an X-Y stage 212 carrying a support 214 for a wafer or other sample 216. An electron optical column 218 generating and electron beam 217.

FIG. 1 illustrates the maximum tilt attitude which a stage 212 and sample 216 may assume in a conventional charged particle apparatus. In FIG. 1 the angle which a stage normal 220 subtends with respect to the electron optical axis 217 of the column 218 is designated as angle "A"—here shown as 60 degrees.

It is noted that with a large specimen such as a semiconductor wafer having a diameter as great as 12 inches, the chamber height H is quite large. As discussed above, an aggravated height of the chamber implies an increased chamber inner surface and chamber volume, with associated extended pumping volumes, high levels of outgassing from the chamber inner surface 224, and undesirably large weight and equipment cost.

As discussed, the steep angle which the sample 216 assumes can create serious problems if the sample is, for example, a semiconductor wafer, the position of which during processing must be held to tolerance of less than a few microns. The weight of the wafer alone can lead to shifting of the position of the sample 216 on its support 214.

It can also be understood from FIG. 1 that as the typically massive stage 212 is rotated, its eccentric center of gravity places great demands on the motive and support system for tilting the stage.

Figure 2:
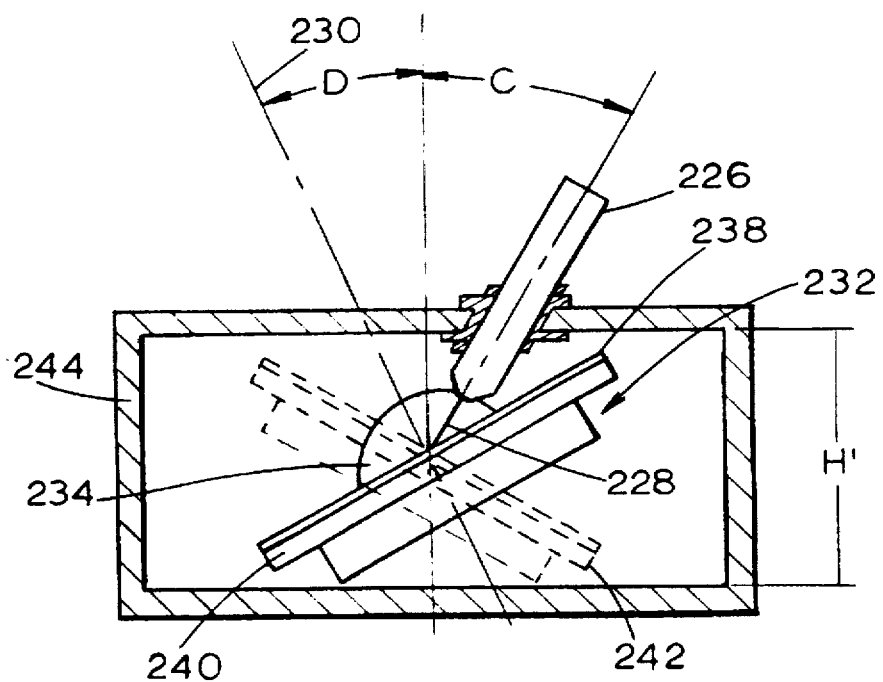
FIG. 2 is a schematic illustration corresponding to FIG. 1, but illustrating the principles of the present invention.

FIG. 2 schematically illustrates the advantages of the present invention wherein the charged particle column 226 is canted on one side of vertical by a predetermined angle "C". The X-Y stage 232 is tilted such that its normal 230 subtends an angle "D" on the opposite side of vertical from angle C. The angle of incidence of the beam 228 relative to the normal 230 to the stage 232 is thus equal to the sum of the angles C and D. The angle C may be any desired angle, but in a preferred embodiment is 30 degrees.

Tilting motive means 234, shown schematically in FIG. 2, is provided for tilting the stage 232, the sample 238, and the sample support 240. In the illustrated FIG. 2 embodiment, with the column 226 tilted at 30 degrees, in accordance with an aspect of the present invention, the tilting motive means 234 is required to tilt the stage 232 through only 30 degrees in order to establish a 60 degree angle of incidence of the beam 228 relative to the normal 230 to the stage 232.

Tilting of the stage by 30 degrees in the opposite direction, as shown in phantom lines at 242, produces the nominal orthogonal arrangement of column 226 and stage 232.

It can be seen from FIG. 2 that the vacuum chamber 244 in the FIG. 2 embodiment of the invention is much smaller than the vacuum chamber 210 in the FIG. 1 prior art arrangement. The chamber in FIG. 2 has a height "H'" which is substantially less than the height "H" in the FIG. 1 prior art arrangement, leading to very substantially reduced weight, cost, chamber pumping volumes, and outgassing from the inner surfaces of the chamber 244. Further, a smaller chamber is stiffer and more resistant to vibrational intrusions for a given wall thickness.

In accordance with another aspect of the invention, the tilting motive means 234 tilts the stage to a limit attitude at the other end of its range of motion which is such that the stage normal is parallel to the column axis, and the beam is thus normal to the sample.

Figure 3:
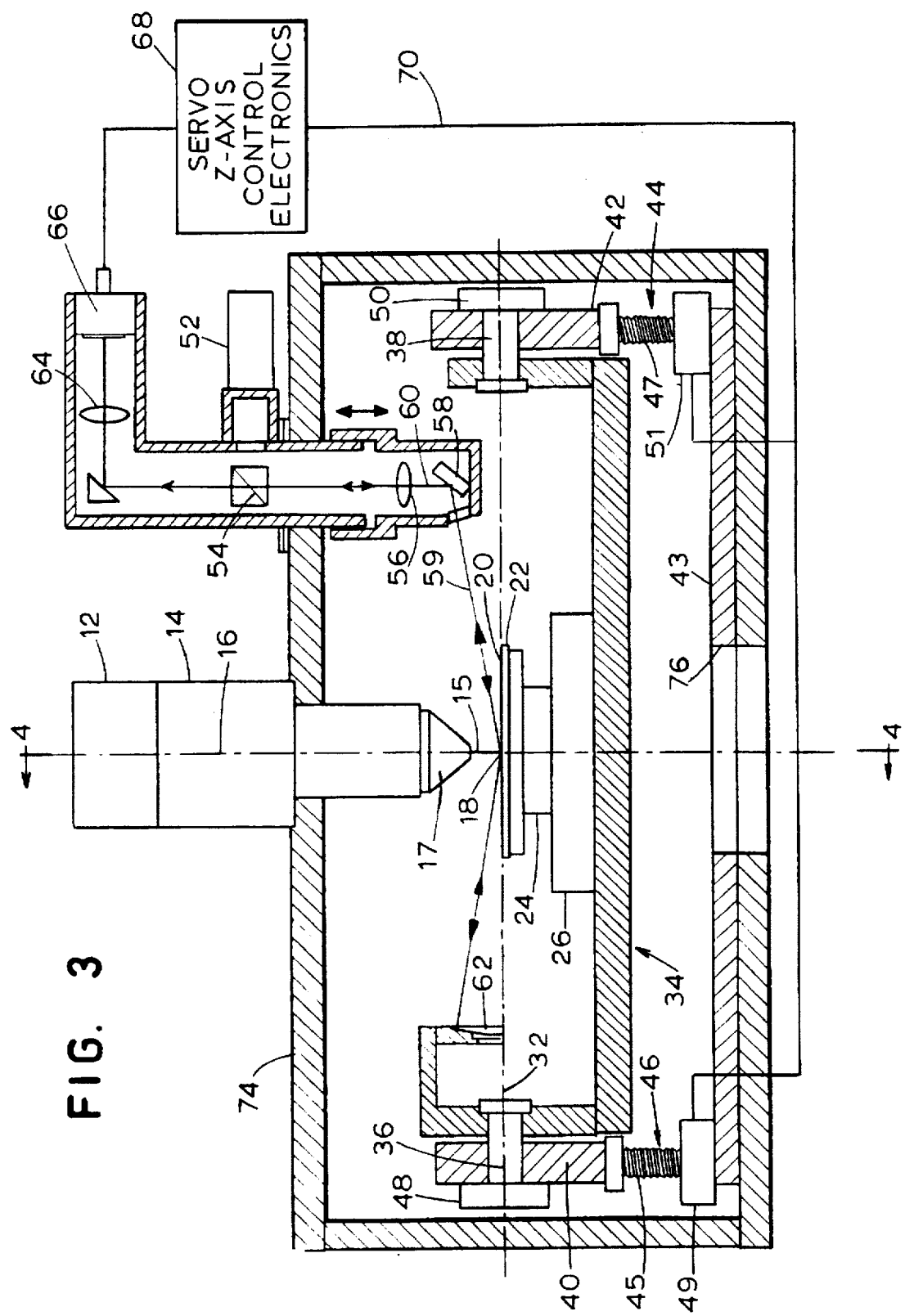
FIG. 3 is a schematic illustration of a preferred embodiment of the present invention.
Figure 4:
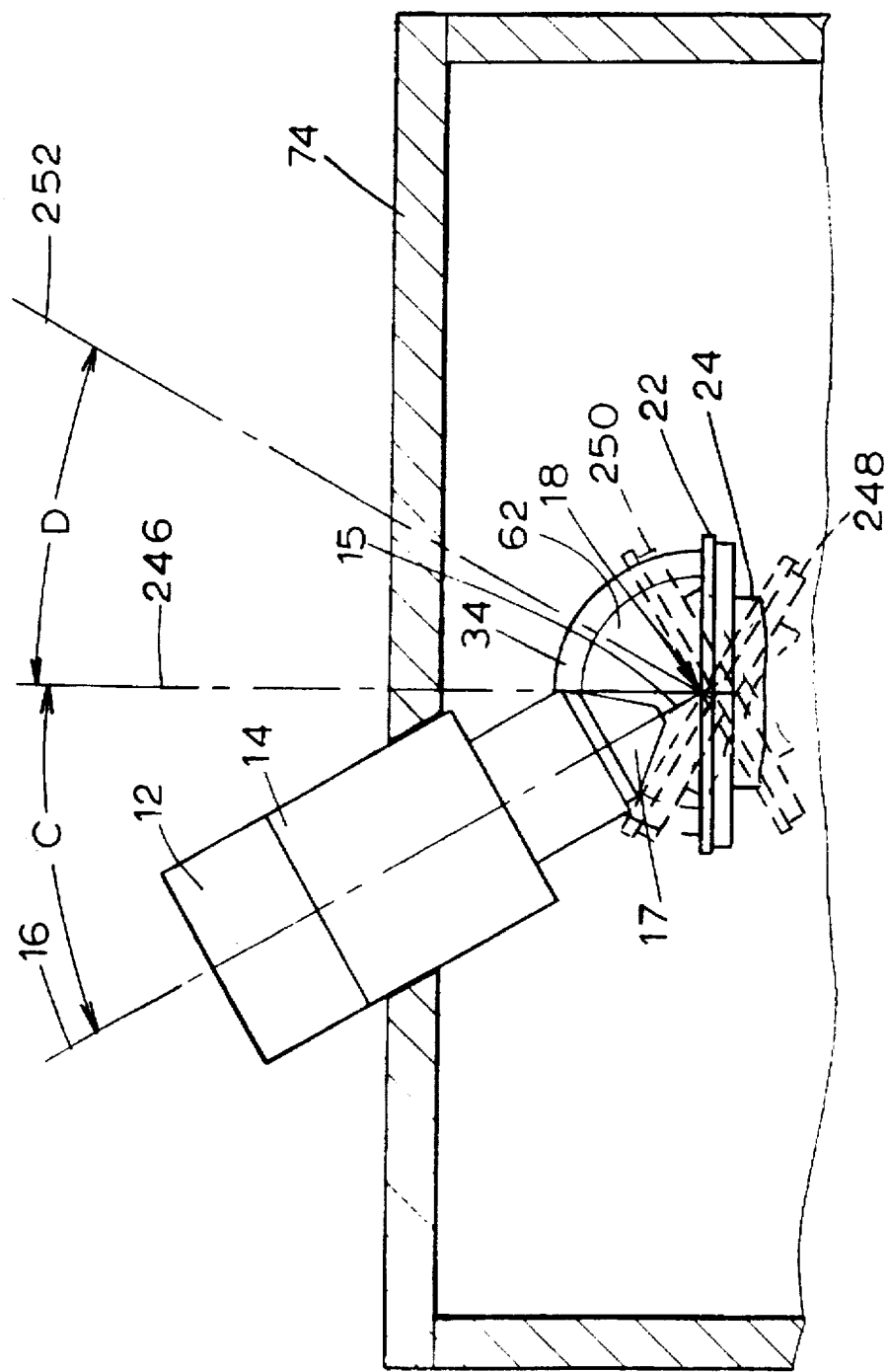
FIG. 4 is a sectional view taken along lines 4—4 in FIG. 3.

FIGS. 3-4 schematically illustrates a system implementing the principles of the present invention. In the FIGS. 3-4 system there is provided a probe-forming charged particle beam system, here shown as a scanning electron microscope. The microscope comprises a gun 12 which may have, e.g., a field emission electron source, and an electron optical column 14 having, for example, a low chromatic aberration conical objective lens 17. The gun 12 and the column 14 together form a beam 15 of electrons. The beam 15 is directed along an electron beam axis 16 and converged to a focal point 18 on a surface 20 of a sample 22, which may, for example, be a semiconductor wafer. Sample support means are shown as comprising an X-motion stage 24 and a Y-motion stage 26. The X and Y motion stages 24, 26 are illustrated in highly schematic form and may in practice comprise any of a variety of conventional electromechanical or mechanical translatory devices.

As will be described in more detail hereinafter, it is a prime object of this invention to provide a charged particle apparatus with a fixed off-vertical column cant and a tiltable sample-supporting stage. A tilt stage is shown as comprising a cradle 34 mounted for rotational movement on trunions 36, 38 in upright base members 40, 42 supported by a horizontal base 43. Tilt motors 48, 50 are provided for selectively varying the tilt angle of the cradle 34 and thus of the sample 22.

The cradle 34 and the supported X-motion stage 24 and Y-motion stage 26 are adjusted in Z-axis position for the purpose of changing the operating distance between the sample 22 and the electron optics of the column 14. Parallel Z-motion stages 44, 46 am provided for varying the position of the cradle 34 and contained sample 22 along the Z-axis.

The Z-motion stages 44, 46 are illustrated in highly schematic form as comprising screws 45, 47 driven by precision motors 49, 51. The Z-motion stages comprise part of a servo system for maintaining the surface 20 of sample 22 at a prescribed position on the Z-axis, and is capable of making gross and fine adjustments in the Z-position of a specimen or object.

An autofocusing system is coupled to the object support means for adjusting the position of the support means along the particle beam or "Z" axis. The autofocusing system includes an optical beam system comprising means for developing an optical beam, here shown as a laser 52. A 45 degree semireflective mirror 54, lens 56 and mirror 58 direct the optical beam 15 from the laser 52 transversely to the particle electron beam axis 16 and at an acute angle to the surface 20 of the sample 22. The mirror 54, lens 56 and mirror 58 act on the beam to form a first optical beam focus on a surface 20 of the sample 22, preferably approximately coincident with the focal point 18 of the electron beam 15.

An optical image forming mirror means, preferably a spherical mirror 62, collects radiation from the optical beam first focus and forms a second focus in the vicinity of the beam first focus. A change in the height or position of the wafer surface 20 along the electron beam axis 16 produces a change in the position of the second focus formed by the mirror 62 indicative of the sample surface height change.

Radiation from the second focus produced by the mirror means 62 reflects off mirror 58, and is imaged by lens 56 and lens 64 onto an image-position-sensitive detector 66.

The output of detector 66 is supplied to a servo Z-axis control electronics system 68 which develops a DC correction voltage related to the magnitude of the error sensed in the height or position of the sample surface 20. The DC correction signal is supplied by a line 70 to the Z-motion stages 44, 46 for making a corrective zero-seeking adjustments in the Z position of the inspected surface 20 of sample 22. The loop cycles until the inspected wafer surface 20 is at the nominal preset operating distance, which distance corresponds with the proper focal plane of the electron optical system in column 14.

The gross adjustments in the position of the sample can be made by injecting a DC bias voltage into the feedback loop. The autofocusing system is fully described and claimed in U.S. Pat. No. 5,216,235, assigned to the assignee of the present invention.

A vacuum enclosure is shown schematically at 74, including a port 76 through which the vacuum chamber may be evacuated.

Referring particularly to FIG. 4, in accordance with an aspect of the present invention, charged particle beam apparatus, for example a scanning electron microscope, is provided with means for tilting the stages, 24, 26, here shown as cradle 34 and tilt motors 48, 50 for supplying the motive power to tilt the cradle. The stages 24, 26 are tilted through a range of attitudes to a predetermined attitude wherein a normal 252 to the stages defines a predetermined first angle D on one side of vertical when the stages are rotated to a position wherein the angle of incidence of beam 15 relative to the sample 22 is a maximum. In FIG. 4, the stages 24, 26, when in this maximum tilt angle position, are shown in phantom lines at 248. The stages 24, 26 may be tilted to a limit attitude at the other end of the range, shown in phantom lines at 250 wherein the stage normal is parallel to the column axis 16 and the beam 15 is thus normal to the sample 22.

A charged particle beam column, here shown as an electron optical column 14, for irradiating a sample 22 on the stages 24, 26 is canted at a predetermined angle on the opposite side of vertical 246 from the stage normal 252. The maximum angle of beam incidence on the sample 22 relative to the stage normal 252 is equal to the sum of the first and second angles (that is angles C and D in FIG. 4).

This invention makes possible the use of stages which may be symmetrically tilted through a relatively modest tilt angle (30 degrees maximum in the present example), and yet produce a relatively large angle of incidence of the beam relative to a sample supported by the stages (60 degrees in the described preferred embodiment of the invention). By this invention the height, inner surface area and volume are substantially reduced, with attendant improvement in chamber stiffness, weight factor, freedom from contamination due to inner chamber surface outgassing, and equipment through-put. Design burdens on the stage tilt mechanism are dramatically reduced, and the simplified X-Y stage apparatus is more agile and less costly than prior devices. The end result is a system which is significantly more suited to handling large samples at high tilt angles than are prior devices.

The appended claims are therefore intended to cover all such changes and modifications as fall within the true spirit and scope of the invention. The matter set forth in the foregoing description and accompanying drawings is offered by way of illustration only and not as a limitation on the scope of the invention.

For example, whereas the angle of tilt off vertical of the charged particle column has been described in the preferred embodiment as being fixed at 30 degrees, other angles could be chosen to suit the particular design objectives of the apparatus.

Whereas the motive means for tilting the stage has been described in the preferred embodiment as tilting the stage through plus or minus 30 degrees, the range of tilt provided by the tilt motive means could be varied. Whereas the tilting of the stage by the tilt motive means is described as preferably being symmetrical, it is not necessary that the range of motion be symmetrical on either side of horizontal.

What is claimed is:

1. A scanning electron beam microscope for generating an image of a portion of a semiconductor wafer, said scanning electron beam microscope comprising:
   a wafer carrier adapted to support said semiconductor wafer;
   rotation means operatively coupled to said wafer carrier for rotating said wafer carrier;
   positioning means operatively coupled to said wafer carrier for moving said wafer carrier in at least two different directions;
   tilt means operatively coupled to said wafer carrier for tilting said wafer carrier about a tilt axis that lies within a plane coinciding with an upper surface of said semiconductor wafer when said semiconductor wafer is disposed on said wafer carrier, said tilt means allowing said wafer carrier to be tilted between a first tilted position disposed in a first direction, a second tilted position disposed in a second direction opposite said first direction, and an untilted position disposed between said first and second tilted positions;
   a housing for enclosing said wafer carrier, said rotation means, said positioning means and said tilt means;
   an electron optical column for generating an electron beam, said column being canted relative to said wafer carrier so as to produce an electron beam disposed at a non-zero beam angle relative to a ray normal to said wafer carrier when said wafer carrier is in said untilted position, said electron beam being incident upon said semiconductor wafer at an incidence angle relative to a plane parallel to said semiconductor wafer, said incidence angle being at least 30°, said electron optical column being disposed in a fixed position relative to said housing; and
   a detector for detecting radiation emitted from said semiconductor wafer, supported by said wafer carrier at a detection angle relative to a plane parallel to said semiconductor wafer, said detection angle being different than said incidence angle.

2. A scanning electron beam microscope as defined in claim 1 wherein said positioning means is capable of moving said wafer carrier in two mutually perpendicular directions.

3. A scanning electron beam microscope as defined in claim 1 wherein said electron optical column is disposed at an angle of 30° relative to vertical.

4. A scanning electron beam microscope as defined in claim 1 wherein a ray normal to said semiconductor wafer is vertical when said wafer carrier supporting said semiconductor wafer is in said untilted position.

5. A scanning electron beam microscope as defined in claim 1 wherein a ray normal to said semiconductor wafer is 30° from vertical when said wafer carrier supporting said semiconductor wafer is in said first and second tilted positions.

6. A scanning electron beam microscope as defined in claim 1 wherein said angle of incidence is between 30° and 90°.

* * * * *